(12) United States Patent
Yu et al.

(10) Patent No.: US 10,727,223 B2
(45) Date of Patent: Jul. 28, 2020

(54) THIN FILM RESISTOR

(71) Applicant: Taiwan Semiconductor Manufacturing Co., Ltd., Hsinchu (TW)

(72) Inventors: Hung-Chih Yu, Hsinchu (TW); Chien-Mao Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/965,878

(22) Filed: Apr. 28, 2018

(65) Prior Publication Data

US 2019/0148361 A1 May 16, 2019

Related U.S. Application Data

(60) Provisional application No. 62/585,450, filed on Nov. 13, 2017.

(51) Int. Cl.
| | |
|---|---|
| *H01L 27/06* | (2006.01) |
| *H01C 17/14* | (2006.01) |
| *H01L 21/8238* | (2006.01) |
| *H01L 49/02* | (2006.01) |
| *H01L 27/01* | (2006.01) |
| *H01C 7/00* | (2006.01) |

(52) U.S. Cl.
CPC ......... *H01L 27/0629* (2013.01); *H01C 7/006* (2013.01); *H01C 17/14* (2013.01); *H01L 21/823878* (2013.01); *H01L 27/016* (2013.01); *H01L 28/24* (2013.01); *H01L 21/823842* (2013.01)

(58) Field of Classification Search
CPC .... H01L 27/0629; H01L 27/016; H01C 7/006
USPC ........................................................ 257/379
See application file for complete search history.

(56) References Cited

U.S. PATENT DOCUMENTS

| | | | | |
|---|---|---|---|---|
| 2010/0311231 A1* | 12/2010 | Thei | ................ | H01L 21/823842 438/587 |
| 2011/0073957 A1* | 3/2011 | Chiu | ................... | H01L 27/0629 257/380 |
| 2011/0195557 A1* | 8/2011 | Teo | ................ | H01L 21/823842 438/384 |
| 2012/0217586 A1* | 8/2012 | Chern | ................ | H01L 27/0629 257/380 |
| 2012/0313144 A1* | 12/2012 | Zhang | .................... | H01L 21/84 257/192 |
| 2013/0140641 A1* | 6/2013 | Chuang | ........... | H01L 21/823842 257/369 |
| 2013/0270647 A1* | 10/2013 | Zhu | ....................... | H01L 21/022 257/369 |
| 2013/0285150 A1* | 10/2013 | Chen | ...................... | H01L 29/78 257/369 |
| 2013/0285151 A1* | 10/2013 | Wu | ................. | H01L 21/823842 257/369 |

(Continued)

*Primary Examiner* — Lex H Malsawma
*Assistant Examiner* — Eric W Jones
(74) *Attorney, Agent, or Firm* — Duane Morris LLP

(57) ABSTRACT

A semiconductor device includes: a metal thin film disposed on a semiconductor substrate; and first and second contact structures disposed on the metal thin film, wherein the first and second contact structures are laterally spaced from each other by a dummy layer that comprises at least one polishing resistance material.

20 Claims, 9 Drawing Sheets

(56) References Cited

U.S. PATENT DOCUMENTS

| | | | | |
|---|---|---|---|---|
| 2013/0299913 A1* | 11/2013 | Lin | ................ | H01L 21/823842 |
| | | | | 257/369 |
| 2014/0319620 A1* | 10/2014 | Hoentschel | ............ | H01L 28/20 |
| | | | | 257/379 |
| 2015/0187583 A1* | 7/2015 | Montgomery | ........ | H01L 21/266 |
| | | | | 438/238 |
| 2016/0068713 A1 | 3/2016 | Kitamura et al. | | |
| 2016/0093715 A1* | 3/2016 | Liu | ................... | H01L 29/66545 |
| | | | | 257/401 |

* cited by examiner

THIN FILM RESISTOR

CROSS-REFERENCE TO RELATED APPLICATION

The present application claims priority to U.S. Provisional Patent Application No. 62/585,450, filed on Nov. 13, 2017, which is incorporated by reference herein in its entirety.

BACKGROUND

Resistors are standard components in many semiconductor integrated circuits. For example, the resistor is typically used to control respective resistances of other electronic components of an integrated circuit, which can be a radio frequency (RF) circuit (e.g., an oscillator, phase-shift network, filter, converter, etc.), a memory (e.g., a dynamic random access memory (DRAM), a static random access memory (SRAM), etc.) circuit, and any of a variety of analog/mixed-signal circuits.

The resistor is typically implemented by a thin film resistor, formed of a metal thin film, so as to provide a low temperature coefficient of resistivity (TCR) and a wider sheet resistance tolerance when compared to resistors formed in other structures, and/or of other materials. Conventionally, when making such a thin film resistor concurrently with a metal gate of a field-effect transistor, which is typically referred to as a middle-end-of-line (MEOL) process, a chemical-mechanical polishing (CMP) process is performed on a substantially long polysilicon line structure that overlays the metal thin film to form the metal gate and contacts of the thin film resistor. Due to such substantially long extension of the polysilicon line structure, a CMP dishing and/or erosion effect occurs to the polysilicon line structure, which may directly or indirectly cause various issues such as, for example, over-polishing on the polysilicon line structure, over-etching on respective contact of the thin film resistor, etc.

Therefore, conventional thin film resistor, and methods to form the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1A:
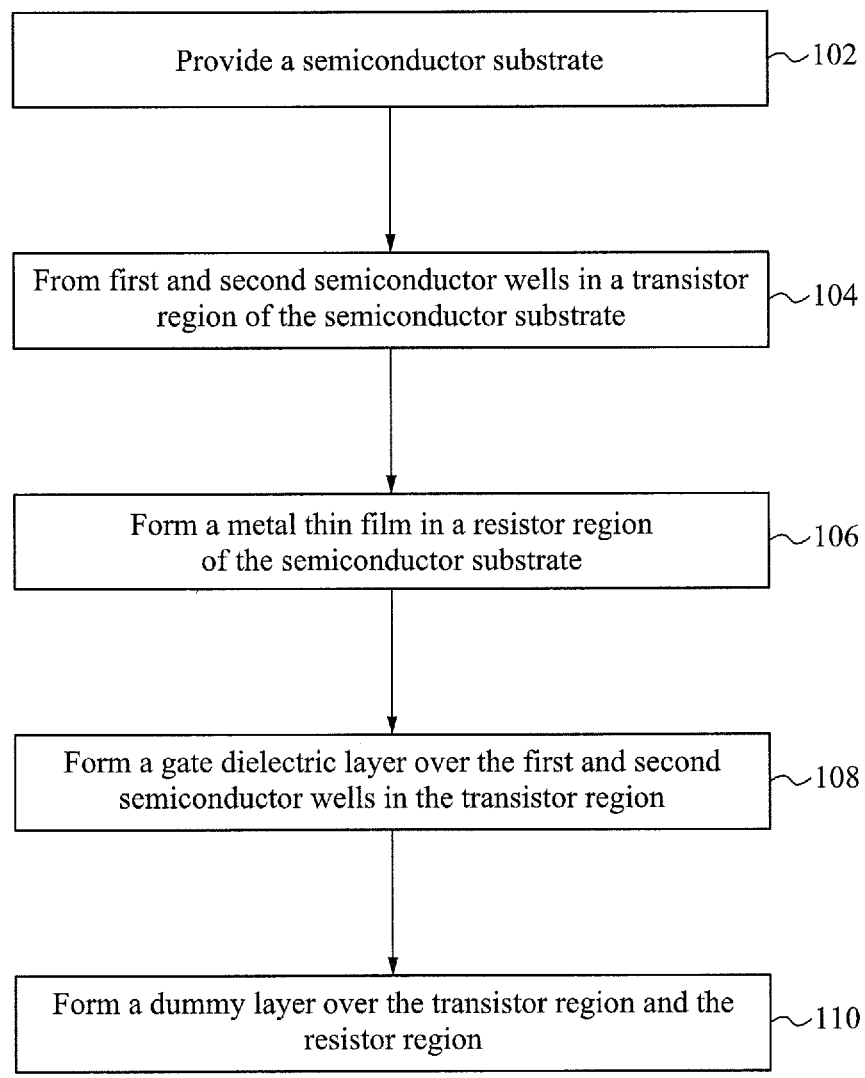
FIG. 1 illustrates a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative tend's, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device including a thin film resistor. In some embodiments, the disclosed thin film resistor includes a metal thin film disposed above a semiconductor substrate and below a dummy layer (e.g., a polysilicon line structure), and two contact structures located on respective ends of the metal thin film, wherein the dummy layer includes at least one recessed region laterally spaced apart from the two contact structures that is filled with a polishing resistance material. As such, when performing a CMP process on the dummy layer, since the at least one recessed region embedded in the dummy layer is filled with the polishing resistance material, the above-mentioned dishing/erosion effect may be minimized.

Further, in some embodiments, the disclosed thin film resistor is formed in a resistor region on the semiconductor substrate, and on the other hand, in a transistor region on the semiconductor substrate, one or more metal-oxide-semiconductor field-effect transistors (MOSFETs) may be formed concurrently with the thin film resistor. In particular, in some embodiments, the contact structures of the thin film resistor may be formed concurrently with the formation of a metal gate of a p-type MOSFET in the transistor region, and the recessed region may be filled with the polishing resistance material concurrently with the formation of a metal gate of an n-type MOSFET in the transistor region. Accordingly, the disclosed thin film resistor can be formed using fabrication steps compatible with current complementary MOS (CMOS) fabrication technologies, and may only use at most one pattern to define the recessed region in the dummy layer.

Figure 1B:
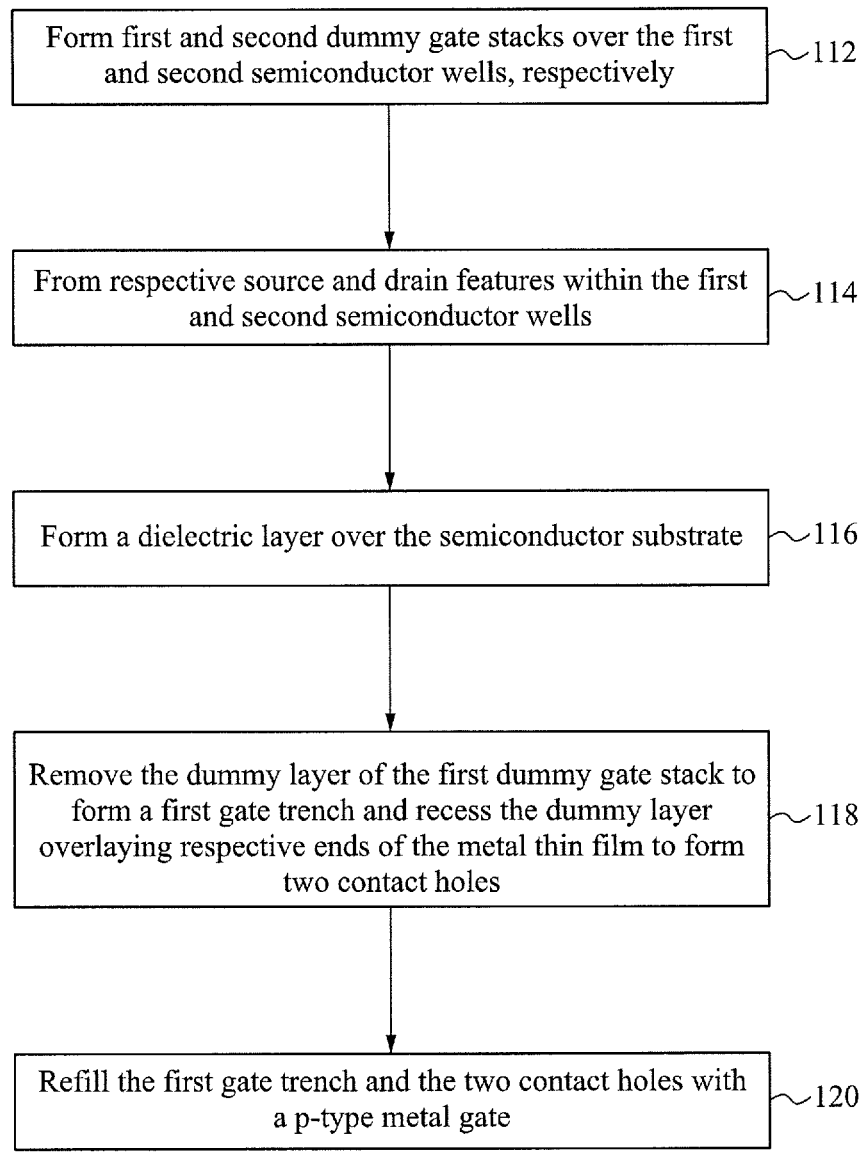
Figure 1C:
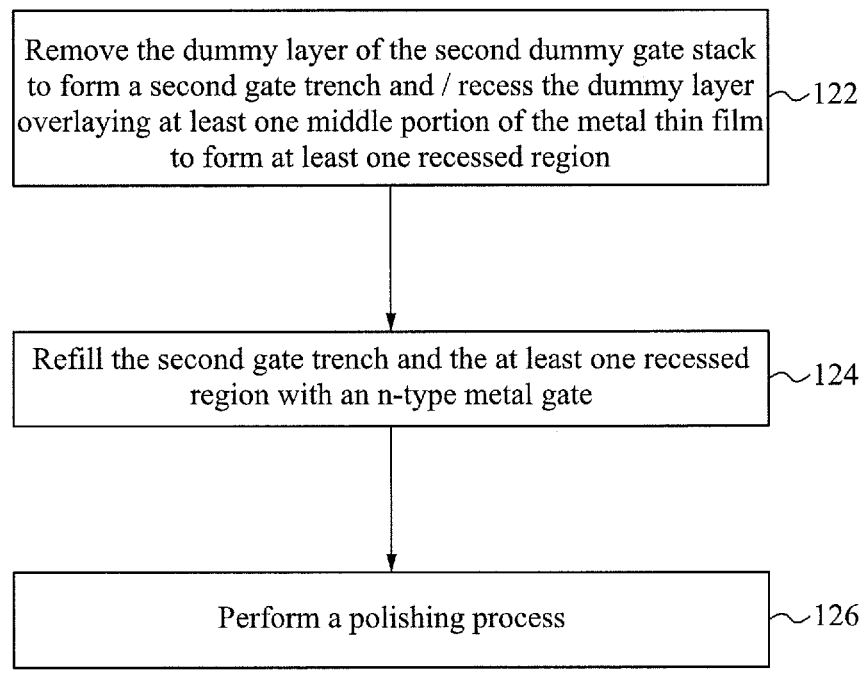

FIGS. 1A, 1B, and 1C collectively illustrate a flowchart of a method 100 to form a semiconductor device, including a thin film resistor, according to one or more embodiments of the present disclosure. It is noted that the method 100 is merely an example, and is not intended to limit the present disclosure. Accordingly, it is understood that additional operations may be provided before, during, and after the method 100 of FIGS. 1A-1C, and that some other operations may only be briefly described herein. In some embodiments, operations of the method 100 may be associated with cross-sectional views of a semiconductor device at various fabrication stages as shown in FIGS. 2A, 2B, 2C, 2D, 2E, 2F, 2G, 2H, 2I, 2J, 2K, 2L, and 2M, respectively, which will be discussed in further detail below.

Referring now to FIG. 1A, the method 100 starts with operation 102 in which a semiconductor substrate is provided. In some embodiments, when the semiconductor substrate is provided, a plurality of isolation features (e.g., shallow trench isolation (STI) features) may be formed over a main surface of the semiconductor substrate. Accordingly, the semiconductor substrate may be divided into at least two regions, a transistor region and a resistor region, by such a plurality of isolation features. The method 100 continues to operation 104 in which first and second semiconductor wells are respectively formed in the transistor region of the semiconductor substrate. In some embodiments, the first and second semiconductor wells, laterally spaced from each other by at least one of the plurality of isolation features, are formed with respective different doping types. For example, the first semiconductor well is doped with a first doping type (e.g., n-type); and the second semiconductor well is doped with a second doping type (e.g., p-type). The method 100 continues to operation 106 in which a metal thin film is formed in the resistor region of the semiconductor substrate. The method 100 continues to operation 108 in which a gate dielectric layer is formed over the first and second semiconductor wells in the transistor region. In some alternative embodiments, the gate dielectric layer may be also formed over the metal thin film in the resistor region. The method 100 continues to operation 110 in which a dummy layer is formed over the transistor region and the resistor region. In some embodiments, the dummy layer may be formed of a polysilicon material, which is used to form respective dummy gate stacks over the first and second semiconductor regions, as will be discussed in further detail below.

Referring then to FIG. 1B, the method 100 continues to operation 112 in which first and second dummy gate stacks are formed over the first and second semiconductor regions, respectively. In some embodiments, the first dummy gate stack, including a first portion of the dummy layer and a first portion of the gate dielectric layer directly below the first portion of the dummy layer, is disposed over a middle portion of the first semiconductor region; and the second dummy gate stack, including a second portion of the dummy layer and a second portion of the gate dielectric layer directly below the second portion of the dummy layer, is disposed over a middle portion of the second semiconductor region. The method 100 continues to operation 114 in which respective source and drain features are formed within the first and second semiconductor wells. In some embodiments, within the first semiconductor well, the source and drain features are respectively formed on sides of the first dummy gate stack; and within the second semiconductor well, the source and drain features are respectively formed on sides of the second dummy gate stack. The method 100 continues to operation 116 in which a dielectric layer is formed over the semiconductor substrate. In some embodiments, the dielectric layer may be an inter-layer dielectric (ILD) layer filling a space between the first and second dummy gate stacks in the transistor region, and/or another space between at least one of the first and second dummy gate stacks and the dummy layer in the resistor region. The method 100 continues to operation 118 in which the dummy layer of the first dummy gate stack is removed to form a first gate trench in the first dummy gate stack, and the dummy layer overlaying respective end portions of the metal thin film is recessed to form two contact holes. As such, the gate dielectric layer of the first dummy gate stack may be re-exposed, and portions of a top surface of the metal thin film (e.g., the portions of the top surface at the respective ends of the metal thin film) may be also re-exposed. The method 100 continues to operation 120 in which the first gate trench and the two contact holes are each refilled with a first conductive layer to form a p-type metal gate. In some embodiments, the first conductive layer (i.e., the p-type metal gate) may include two or more gate material layers stacked on top of one another, for example, a p-type work function layer, which is typically referred to as a p-metal, and a conductive layer.

Referring then to FIG. 1C, the method 100 continues to operation 122 in which the dummy layer of the second dummy gate stack is removed to form a second gate trench in the second dummy gate stack, and the dummy layer overlaying at least one middle portion of the metal thin film is recessed to form at least one recessed region. As such, the gate dielectric layer of the second dummy gate stack may be re-exposed, and at least a portion of the top surface of the metal thin film (e.g., the portion of the top surface at the middle of the metal thin film) may be also re-exposed. The method 100 continues to operation 124 in which the second gate trench and the at least one recessed region are each refilled with a second conductive layer. In some embodiments, the second conductive layer may include two or more gate material layers stacked on top of one another, for example, an n-type work function layer, which is typically referred to as a n-metal, and a conductive layer. The method 100 continues to operation 126 in which a polishing process in performed. In some embodiments, the polishing process includes using a chemical mechanical polishing (CMP) process to remove excessive second conductive layer to form an n-type metal gate and a polishing resistance structure.

As mentioned above, FIGS. 2A-2M illustrate, in a cross-sectional view, a portion of a semiconductor device 200, including a thin film resistor, at various fabrication stages of the method 100 of FIG. 1. The semiconductor device 200 may be included in a microprocessor, memory cell, and/or other integrated circuit (IC). Also, FIGS. 2A-2M are simplified for a better understanding of the concepts of the present disclosure. Although the figures illustrate the semiconductor device 200, it is understood the IC may comprise a number of other devices such as resistors, capacitors, inductors, fuses, etc., which are not shown in FIGS. 2A-2M, for purposes of clarity of illustration.

Figure 2A:
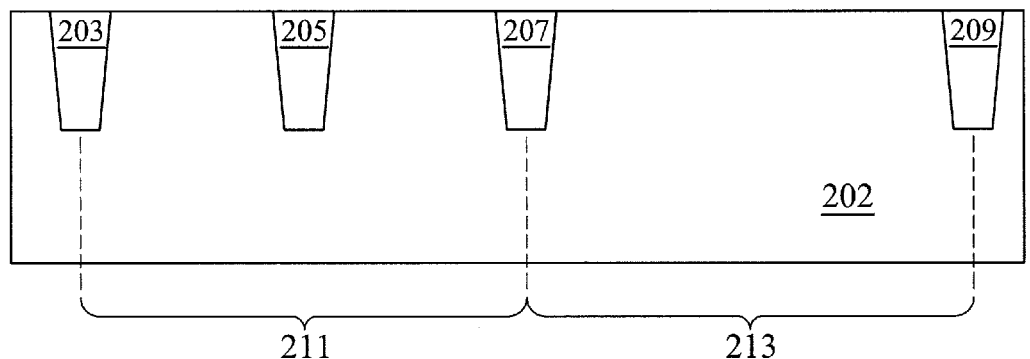
FIGS. 2A, 2B, 2C, 2D, 2E, 2F, 2G, 2H, 2I, 2J, 2K, 2L, and 2M illustrate cross-sectional views of an exemplary semiconductor device during various fabrication stages, made by the method of FIG. 1, in accordance with some embodiments.

Corresponding to operation 102 of FIG. 1A, FIG. 2A is a cross-sectional view of the semiconductor device 200 including a semiconductor substrate 202 at one of the various stages of fabrication, in accordance with some embodiments. As shown, when the semiconductor substrate 202 is provided, the semiconductor substrate 202 may include a plurality of isolation features (e.g., STI features) 203, 205, 207, and 209 over a major surface 202' of the semiconductor substrate 202. In some embodiments, within (e.g., surrounded by) the isolation features 203 and 207, a transistor region 211, where one or more MOSFETs are to be formed, may be defined; and within (e.g., surrounded by) the isolation features 207 and 209, a resistor region 213, where one or more resistors are to be formed, may be defined.

In some embodiments, the semiconductor substrate 202 includes a silicon substrate. Alternatively, the semiconductor substrate 202 may include other elementary semiconductor material such as, for example, germanium. The semiconductor substrate 202 may also include a compound semiconductor such as silicon carbide, gallium arsenic, indium arsenide, and indium phosphide. The semiconductor substrate 202 may include an alloy semiconductor such as silicon germanium, silicon germanium carbide, gallium arsenic phosphide, and gallium indium phosphide. In one embodiment, the semiconductor substrate 202 includes an epitaxial layer. For example, the substrate may have an epitaxial layer overlying a bulk semiconductor. Furthermore, the semiconductor substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

Figure 2B:
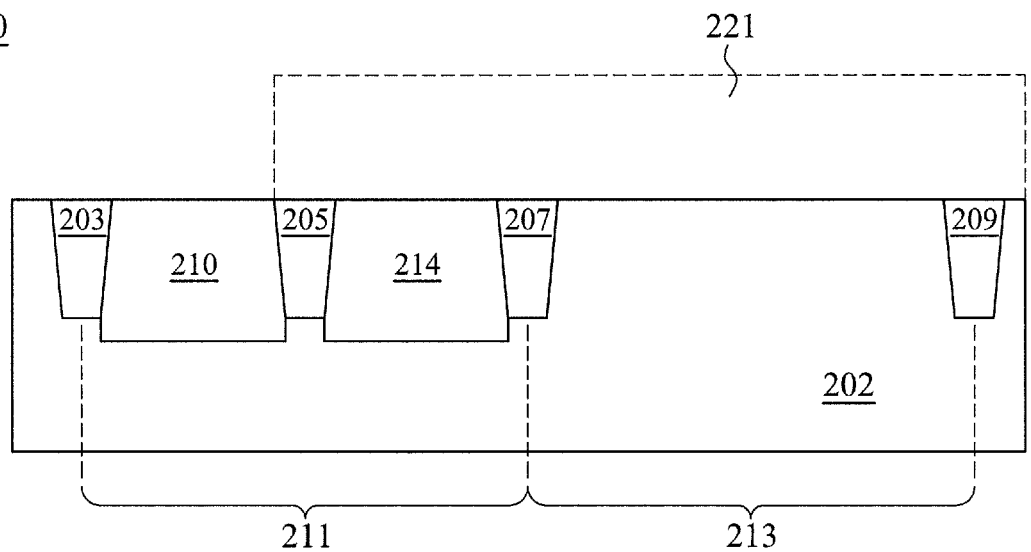

Corresponding to operation 104 of FIG. 1A, FIG. 2B is a cross-sectional view of the semiconductor device 200 including a first semiconductor well 210 and a second semiconductor well 214, which are respectively formed at one or more of the various stages of fabrication, in accordance with some embodiments. As shown, the first semiconductor well 210 is formed to be laterally between the isolation features 203 and 205 (i.e., within the transistor region 211), and vertically extend into the semiconductor substrate 202; and the second semiconductor well 214 is formed to be laterally between the isolation features 205 and 207 (i.e., within the transistor region 211), and vertically extend into the semiconductor substrate 202. In some embodiments, the first semiconductor well 210 is doped with a first doping type (e.g., n-type) of dopants, for example, phosphorous (P), arsenic (As), antimony (Sb), etc.; and the second semiconductor well 214 is doped with a second doping type of dopants, different from the first doping type (e.g., p-type). Exemplary p-type dopants include boron (B), gallium (Ga), aluminum (Al), etc.

In some embodiments, the first semiconductor well 210 may be first formed by performing a series of processes, and the second semiconductor well 214 may be then formed following the similar series of processes. For brevity, only the formation of the first semiconductor well 210 is herein discussed. In some embodiments, the first semiconductor well 210 may be formed by performing at least some of the following processes: forming a removable layer (e.g., a photoresist layer, a hardmask layer, etc.) 221 over the semiconductor substrate 202 to expose an area where the first semiconductor well 210 is intended to be formed; performing a doping process (e.g., an ion implantation process, a diffusion process, etc.) to incorporate a plurality of dopants with the first doping type (n-type) into the semiconductor substrate 202; removing the removable layer 221; and performing an optional annealing process to activate the incorporated dopants.

Figure 2C:
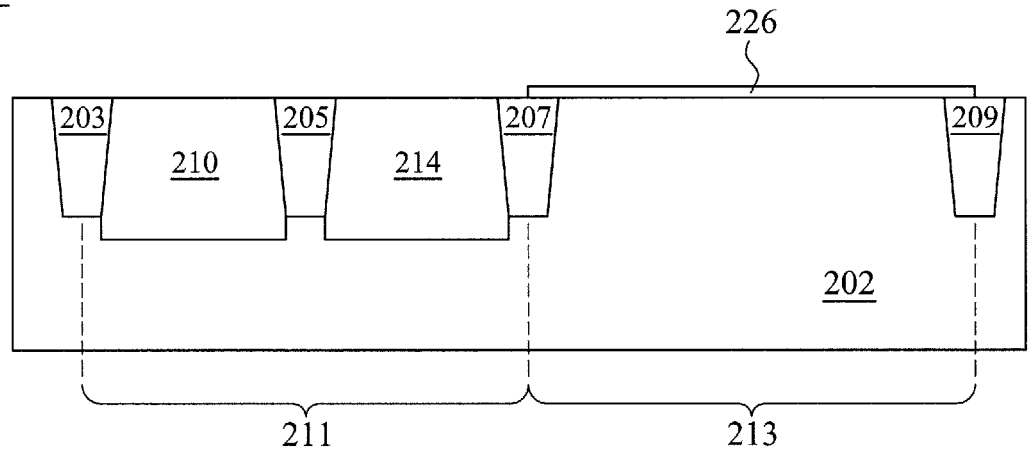

Corresponding to operation 106 of FIG. 1A, FIG. 2C is a cross-sectional view of the semiconductor device 200 including a metal thin film 226, which is formed at one of the various stages of fabrication, in accordance with some embodiments. As shown, the metal thin film 226 is disposed in the resistor region 213, and more specifically, above the major surface 202' and laterally between the isolation features 207 and 209.

In some embodiments, the metal thin film 226 is formed of a metal material that is selected from at least one of: tantalum (Ta), tantalum nitride (TaN), titanium (Ti), titanium nitride (TiN), tungsten (W), tungsten nitride (WN), nickel chromium (NiCr), silicon chromium (SiCr), and a combination thereof. In some embodiments, the metal thin film 226 may be formed by using one of the following deposition techniques: chemical vapor deposition (CVD), physical vapor deposition (PVD), atomic layer deposition (ALD), spin-on coating, e-gun, sputtering, and/or other suitable metal material deposition techniques to deposit the above-described metal material on the semiconductor substrate 202 (in the resistor region 213). In one example, the metal thin film 226 includes a thickness ranging between about 5 angstrom meter and about 50 angstrom meter.

Figure 2D:
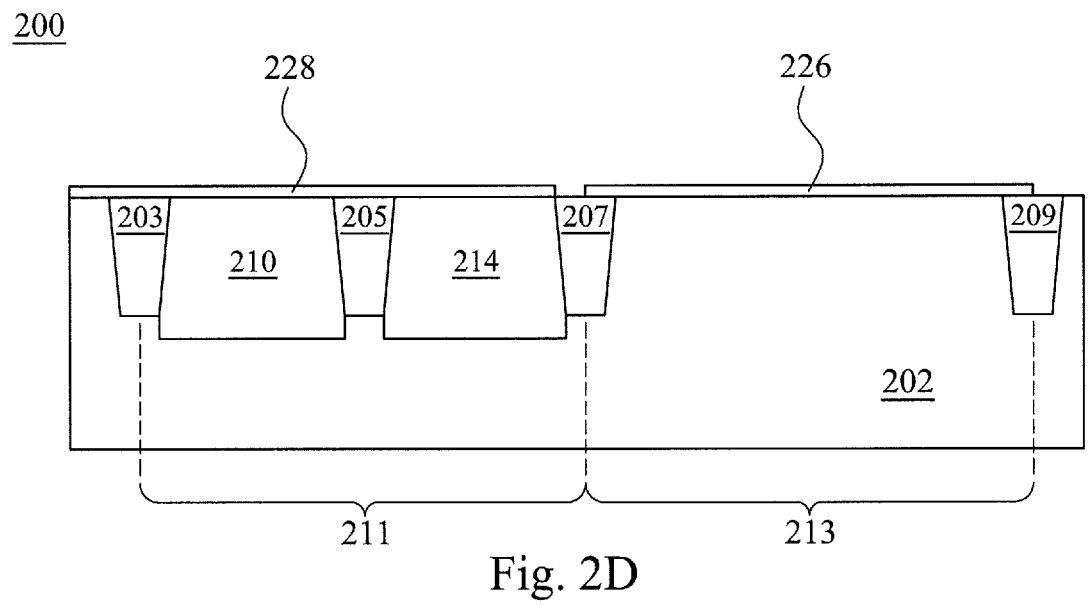

Corresponding to operation 108 of FIG. 1A, FIG. 2D is a cross-sectional view of the semiconductor device 200 including a gate dielectric layer 228, which is formed at one of the various stages of fabrication, in accordance with some embodiments. As shown, the gate dielectric layer 228 is disposed in the transistor region 228, and more specifically, above the first and second semiconductor wells 210 and 214. Although in the illustrated embodiment of FIG. 2D (and the following figures), the gate dielectric layer 228 is shown as a single layer, it is understood that the gate dielectric layer 228 may include plural stacked layers on top of one another while remaining within the scope of the present disclosure.

In some embodiments, the gate dielectric layer 228 may be formed of a high-k dielectric material. Accordingly, the gate dielectric layer 228 includes a dielectric material having the dielectric constant higher than that of thermal silicon oxide, which is about 3.9. In one example, the gate dielectric layer 228 includes hafnium oxide (HfO). In various examples, the gate dielectric layer 228 includes metal oxide, metal nitride, or combinations thereof. In some embodiments, the gate dielectric layer 228 may be formed by using one of the following deposition techniques: chemical vapor deposition (CVD), physical vapor deposition (PVD), atomic layer deposition (ALD), spin-on coating, and/or other suitable metal material deposition techniques to deposit the above-described dielectric material overlaying the first and second semiconductor wells 210 and 214 (i.e., the transistor region 211), as shown in FIG. 2D. In some alternative embodiments, the gate dielectric layer 228 may also overlay the metal thin film 226 in the resistor region 213, which may be subsequently removed. In one example, the gate dielectric layer 228 includes a thickness ranging between about 10 angstrom meter and about 100 angstrom meter.

Figure 2E:
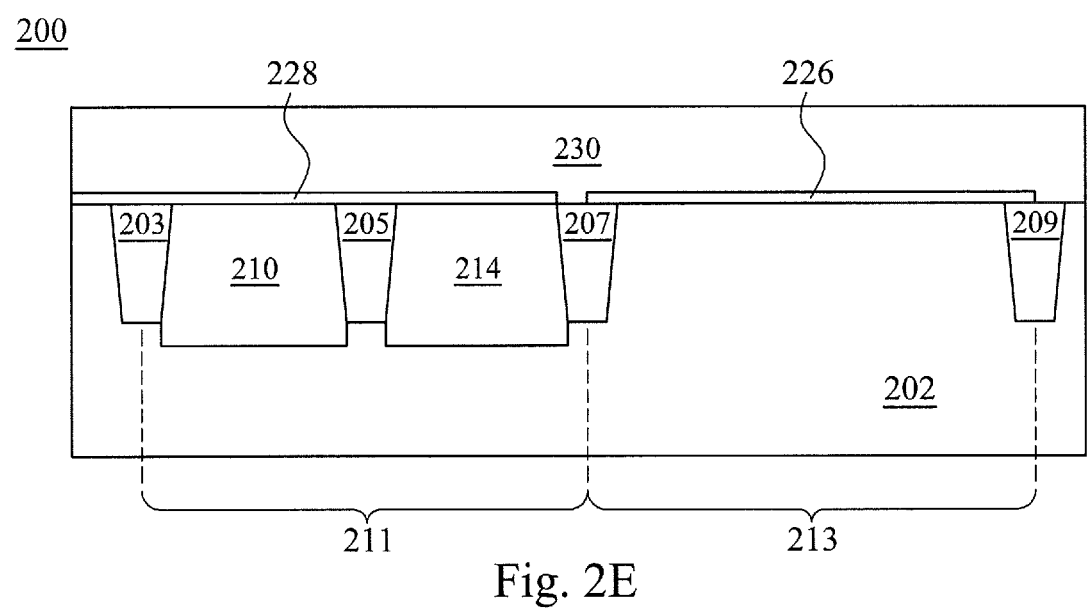

Corresponding to operation 110 of FIG. 1A, FIG. 2E is a cross-sectional view of the semiconductor device 200 including a dummy layer 230, which is formed at one of the various stages of fabrication, in accordance with some embodiments. As shown, the dummy layer 230 overlays both the transistor region 211 and the resistor region 213, in accordance with some embodiments. In some embodiments, the dummy layer 230 is formed of un-doped polysilicon. In some embodiments, the dummy layer 230 may be formed by using one of the following deposition techniques: chemical vapor deposition (CVD), physical vapor deposition (PVD), atomic layer deposition (ALD), spin-on coating, and/or other suitable deposition techniques to deposit the polysilicon to overlay the transistor region 211 and the resistor region 213.

Figure 2F:
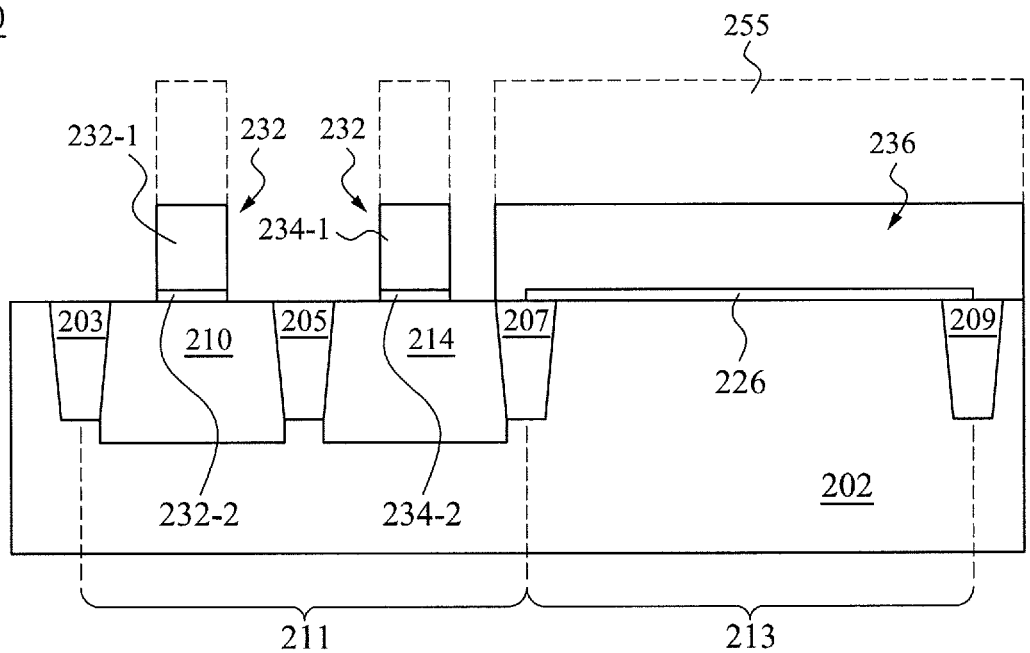

Corresponding to operation 112 of FIG. 1B, FIG. 2F is a cross-sectional view of the semiconductor device 200 including a first dummy gate stack 232 and a second dummy gate stack 234, which are formed at one of the various stages of fabrication, in accordance with some embodiments. In some embodiments, the first and second dummy gate stacks 232 and 234 are formed by performing one or more dry/wet etching processes on the dummy layer 230 and the gate dielectric layer 228 (FIG. 2E) while using a removable layer (e.g., a photoresist layer, a hardmask layer, etc.) 235 as a mask.

As such, in some embodiments, the first dummy gate stack 232 is formed to include a first dummy portion 232-1, which was part of the dummy layer 230, and a first gate dielectric layer 232-2, which was part of the gate dielectric layer 228; and the second dummy gate stack 234 includes a second dummy portion 234-1, which was part of the dummy layer 230, and a second gate dielectric layer 234-2, which was part of the gate dielectric layer 228. And, in some embodiments, a portion 236 of the dummy layer 230, overlaying the metal thin film 226, remains intact. Further, in some embodiments, the first dummy gate stack 232 is disposed at a substantially middle portion of the first semiconductor well 210 so as to expose respective side portions of the first semiconductor well 210; and the second dummy gate stack 234 is disposed at a substantially middle portion of the second semiconductor well 214 so as to expose respective side portions of the second semiconductor well 214.

Figure 2G:
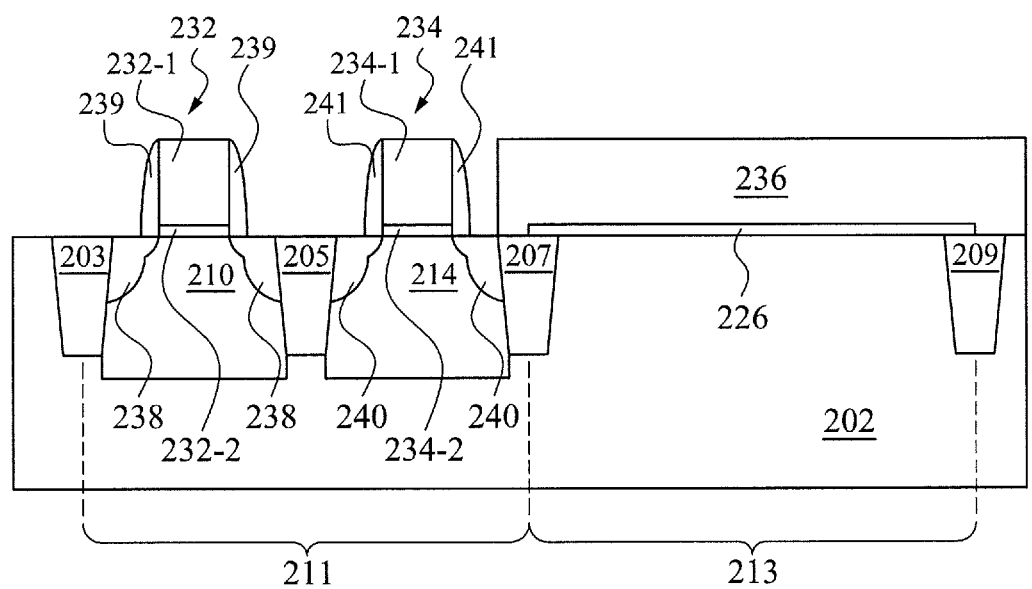

Corresponding to operation 114 of FIG. 1B, FIG. 2G is a cross-sectional view of the semiconductor device 200 including source/drain features 238 and source/drain features 240, which are formed at one of the various stages of fabrication, in accordance with some embodiments. As shown, the source/drain features 238 are formed in the first semiconductor well 210, and more specifically, the source/drain features 238 are laterally disposed at sides of the first dummy gate stack 232; and the source/drain features 240 are formed in the second semiconductor well 214, and more specifically, the source/drain features 240 are laterally disposed at sides of the second dummy gate stack 234. Further, in some embodiments, along respective sidewalls of the first dummy gate stack 232, dielectric spacers 239, which are optional, are formed so as to allow lightly doped drain (LDD) features (not shown) to be formed in the source/drain features 238; and along respective sidewalls of the second dummy gate stack 234, dielectric spacers 241, which are also optional, are formed so as to allow lightly doped drain (LDD) features to be formed in the source/drain features 240.

In some embodiments, the source/drain features 238, in the first semiconductor well 210, is doped with the second doping type of dopants (i.e., opposite to the first doping type of the first semiconductor well 210); and the source/drain features 240, in the second semiconductor well 214, is doped with the first doping type of dopants (i.e., opposite to the second doping type of the second semiconductor well 214). Moreover, the source/drain features 238 may be doped in an elevated doping concentration when compared to the first semiconductor well 210; and the source/drain features 240 may be doped in an elevated doping concentration when compared to the second semiconductor well 214. In some embodiments, the first semiconductor well 210, the first dummy portion 232-1 (which will be replaced by a respective metal gate), the first gate dielectric layer 232-2, and the source/drain features 238 may form a p-type MOSFET; and the second semiconductor well 214, the second dummy portion 234-1 (which will be replaced by a respective metal gate), the second gate dielectric layer 234-2, and the source/drain features 240 may form an n-type MOSFET, as will be discussed below.

In some embodiments, the source/drain features 238 may be formed by performing at least some of the following processes: forming a removable layer (e.g., a photoresist layer, a hardmask layer, etc.) over the semiconductor substrate 202 to expose an area where the source/drain features 238 are intended to be formed; performing a doping process (e.g., an ion implantation process, a diffusion process, etc.) to incorporate a plurality of dopants with the second doping type (p-type) into the first semiconductor well 210; removing the removable layer; and performing an optional annealing process to activate the incorporated dopants. Similarly, the source/drain features 240 may be formed by performing at least some of the following processes: forming a removable layer (e.g., a photoresist layer, a hardmask layer, etc.) over the semiconductor substrate 202 to expose an area where the source/drain features 240 are intended to be formed; performing a doping process (e.g., an ion implantation process, a diffusion process, etc.) to incorporate a plurality of dopants with the first doping type (n-type) into the second semiconductor well 214; removing the removable layer; and performing an optional annealing process to activate the incorporated dopants.

Figure 2H:
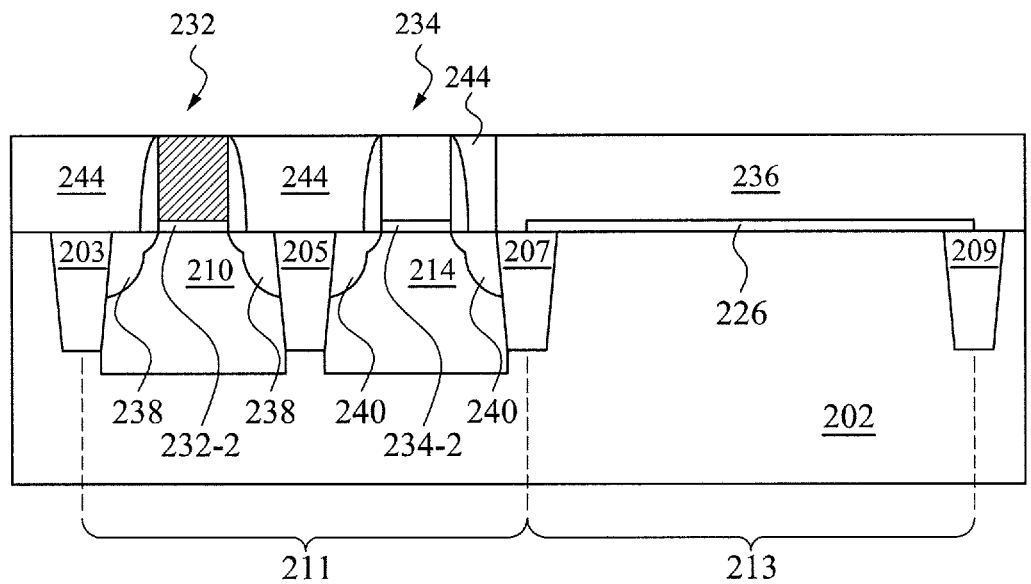

Corresponding to operation 116 of FIG. 1B, FIG. 2H is a cross-sectional view of the semiconductor device 200 including a dielectric layer 244, which is formed at one of the various stages of fabrication, in accordance with some embodiments. As shown, the dielectric layer 244 is formed over the semiconductor substrate 202, and, more specifically, to fill a space between the first and second dummy gate stacks 232 and 234 in the transistor region 211 and another space between the second dummy gate stack 234 and the portion 236 in the resistor region 213.

As mentioned above, the dielectric layer 244 may be an ILD layer that is configured to isolate conductive features disposed at respective different levels/tiers. In some embodiments, the dielectric layer 244 includes a material that is at least one of the following materials, including silicon oxide, a low dielectric constant (low-k) material, other suitable dielectric material, or a combination thereof. The low-k dielectric material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the dielectric layer 244 may be formed by using one of the following deposition techniques: chemical vapor deposition (CVD), physical vapor deposition (PVD), atomic layer deposition (ALD), spin-on coating, and/or other suitable dielectric material deposition techniques to deposit the above-described dielectric material over the semiconductor substrate 202.

Figure 2I:
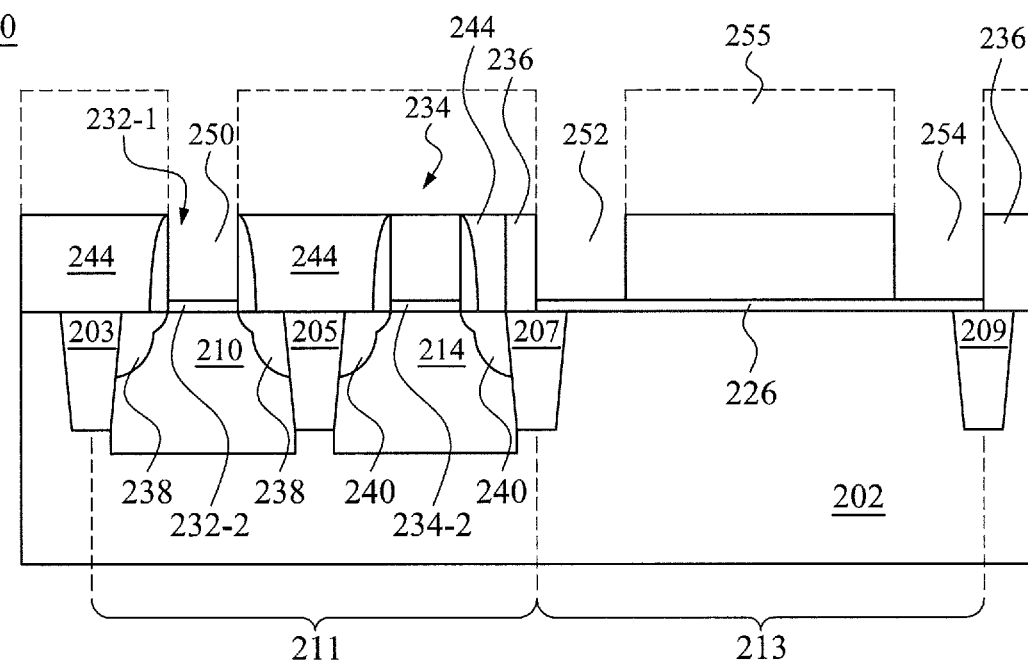

Corresponding to operation 118 of FIG. 1B, FIG. 2I is a cross-sectional view of the semiconductor device 200 including a first gate trench 250 (in the transistor region 211) and two contact holes 252 and 254 (in the resistor region 213), which are formed at one of the various stages of fabrication, in accordance with some embodiments. As shown, the first gate trench 250 is formed by removing the first dummy portion 232-1 of the first dummy gate stack 232; and the contact holes 252 and 254 are formed by removing respective end portions of the dummy portion 236. Accordingly, the first gate dielectric layer 232-2, and end portions of the metal thin film 226 are respectively re-exposed.

In some embodiments, the first gate trench 250 and the contact holes 252/254 may be concurrently formed by performing at least some of the following processes: forming a removable layer (e.g., a photoresist layer, a hardmask layer, etc.) 255 over the dielectric layer 244 and the dummy portion 236 (FIG. 2H) to expose an area where the first gate trench 250 and the contact holes 252/254 are intended to be formed; performing one or more dry/wet etching processes to remove the first dummy portion 232-1 and the end portions of the dummy portion 236; removing the removable layer 255; and performing a cleaning process.

Figure 2J:
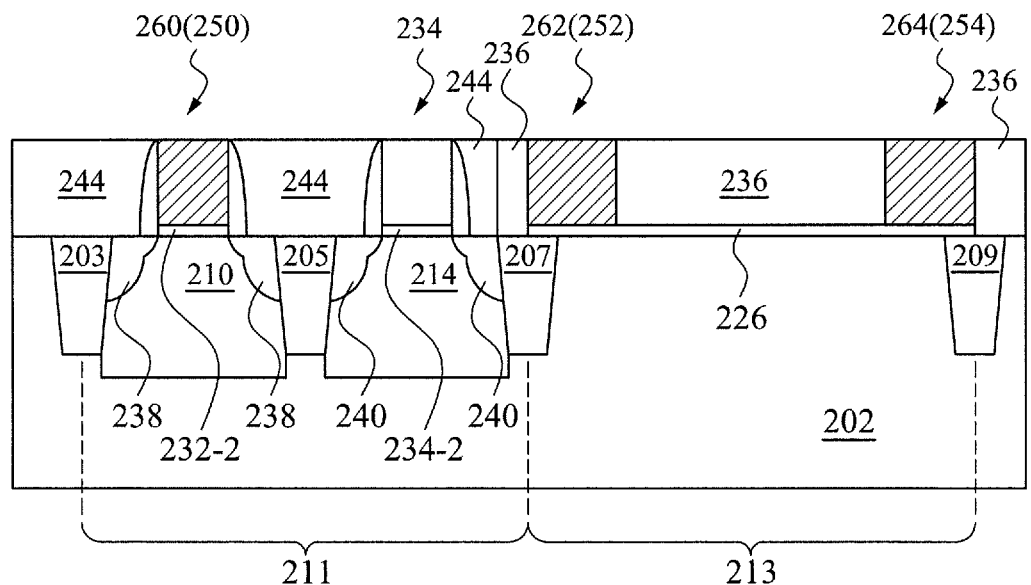

Corresponding to operation 120 of FIG. 1B, FIG. 2J is a cross-sectional view of the semiconductor device 200 including a plurality of metal features 260, 262, and 264, which are formed at one of the various stages of fabrication, in accordance with some embodiments. As shown, the metal features 260, 262, and 264 are formed by concurrently refilling the first gate trench 250 and the contact holes 262 and 264 with one or more conductive layers, which will be discussed below. In some embodiments, since the metal gate 260, together with the first semiconductor well 210, the first gate dielectric layer 232-2, and the source/drain features 238 may form a p-type MOSFET, and the metal gate 260 serves as the metal gate of such a p-type MOSFET, the metal features 260/262/264 are herein referred to as p-type metal features.

Although in the illustrated embodiment of FIG. 2J (and the following figures), the p-type metal features 260/262/264 are each shown as a single layer, in some embodiments, the p-type metal features 260/262/264 may include two or more gate material layers (e.g., p- or n-type work function layers, conductive layers, etc.) stacked on top of one another. For example, the p-type metal features 260/262/264 each includes a p-type work function layer, which is typically referred to as a p-metal, and a conductive layer formed of a conductive material, e.g., aluminum (Al), overlaying the p-metal. In some embodiments, the p-metal has a work function of about or greater than about 5.2 eV. In one embodiment, the p-metal is formed of a conductive material selected from a group consisting of: titanium nitride (TiN), tantalum nitride (TaN), tungsten nitride (WN), and a combination thereof. In some embodiments, the p-type metal features 260/262/264 may be formed by using one of the following deposition techniques: chemical vapor deposition (CVD), physical vapor deposition (PVD), atomic layer deposition (ALD), spin-on coating, e-gun, sputtering, and/or other suitable metal material deposition techniques to respectively overlay the gate trench 250 and the contact holes 252 and 254 with one or more of the above-described gate material layers.

Although not shown, in some other embodiments, one or more p-type metal features may be concurrently formed with the p-type metal features 260/262/264 and disposed between the p-type metal features 262 and 264. Such one or more p-type metal features may provide additional support to the dummy portion 236 while performing a CMP process, which will be discussed in further detail below.

Figure 2K:
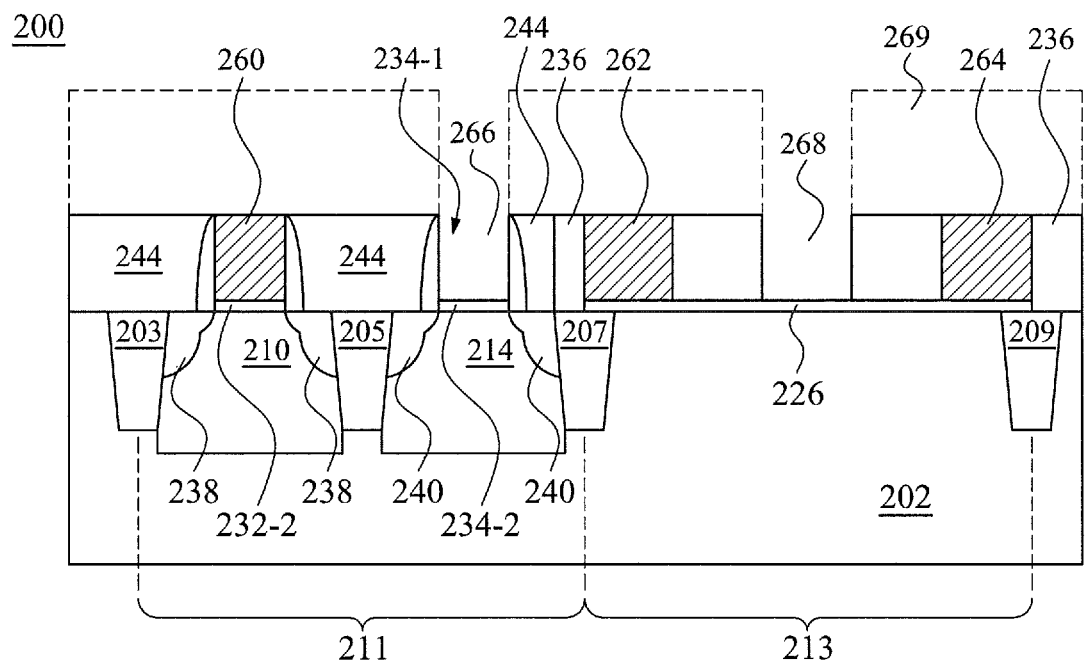

Corresponding to operation 122 of FIG. 1C, FIG. 2K is a cross-sectional view of the semiconductor device 200 including a second gate trench 266 (in the transistor region 211) and a recessed region 268 (in the resistor region 213), which are formed at one of the various stages of fabrication, in accordance with some embodiments. As shown, the second gate trench 250 is formed by removing the second dummy portion 234-1 of the second dummy gate stack 234; and the recessed region 268 is formed by removing a middle portion of the dummy portion 236. Accordingly, the second gate dielectric layer 234-2, and a middle portion of the metal thin film 226 are respectively re-exposed. Although in the illustrated embodiment of FIG. 2K (and the following figures), only one recessed region 268 is formed in the dummy layer 236, it is understood that any desired number (e.g., two or more) of recessed regions can be formed in the dummy layer 236 while remaining within the scope of the present disclosure. Further, when plural recessed regions are formed in the dummy layer 236, the plural recessed regions may or may not be uniformly distributed along the metal thin film 226. In an example where the metal thin film 226 has a length of L measuring from respective inner sidewalls of the p-type metal features 262 to 264 (i.e., the sidewalls facing each other), the plural recessed regions are laterally spaced apart from each other and from the p-type metal features 262/264 by a same width of a respective portion of the dummy layer 236.

In some embodiments, the second gate trench 266 and the recessed region 268 may be concurrently formed by performing at least some of the following processes: forming a removable layer (e.g., a photoresist layer, a hardmask layer, etc.) 269 over the dielectric layer 244 and the dummy portion 236 (FIG. 2J) to expose an area where the second gate trench 266 and the recessed region 268 are intended to be formed; performing one or more dry/wet etching processes to remove the second dummy portion 234-1 and the middle portion of the dummy portion 236; removing the removable layer 269; and performing a cleaning process.

Figure 2L:
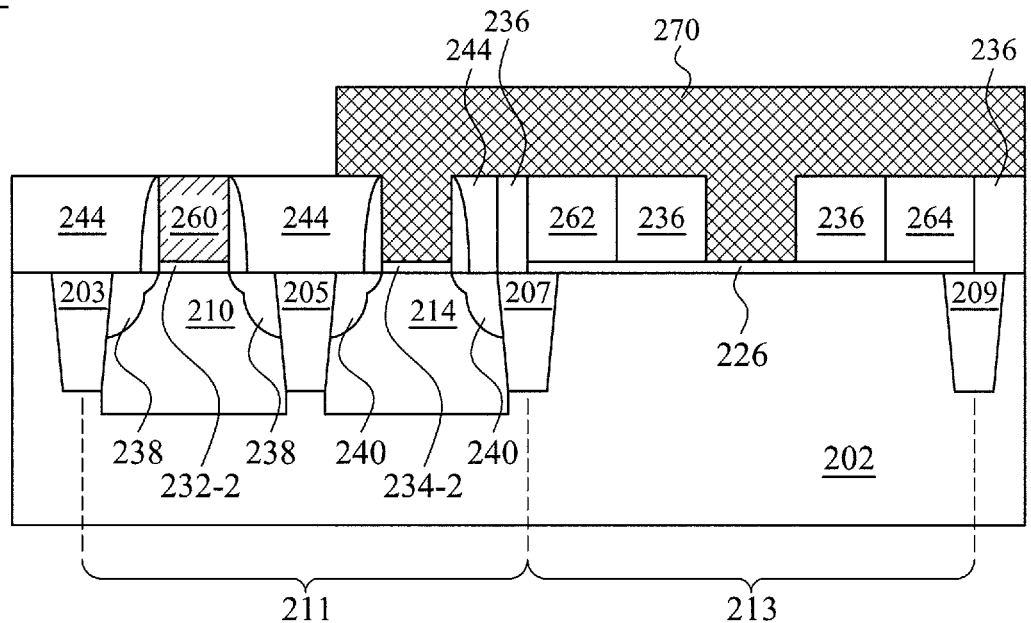

Corresponding to operation 124 of FIG. 1C, FIG. 2L is a cross-sectional view of the semiconductor device 200 including a conductive layer 270, which is formed at one of the various stages of fabrication, in accordance with some embodiments. As shown, the conductive layer 270 overlays a portion of the transistor region 211 and the resistor region 213 so as to refill the second gate trench 266 and the recessed region 268 (FIG. 2K).

Although in the illustrated embodiment of FIG. 2L (and the following figures), the conductive layer 270 is shown as a single layer, in some embodiments, the conductive layer 270 may include two or more gate material layers (e.g., p- or n-type work function layers, conductive layers, etc.) stacked on top of one another. For example, the conductive layer 270 includes an n-type work function layer, which is typically referred to as a n-metal, and a conductive layer formed of a conductive material, e.g., aluminum (Al), overlaying the n-metal. In some embodiments, the n-metal has a work function of about or less than about 4.2 eV. In one embodiment, the n-metal is formed of a conductive material selected from a group consisting of: tantalum (Ta), titanium aluminum (TiAl), titanium aluminum nitride (TiAlN), and a combination thereof. In some embodiments, the conductive layer 270 may be formed by using one of the following deposition techniques: chemical vapor deposition (CVD), physical vapor deposition (PVD), atomic layer deposition (ALD), spin-on coating, e-gun, sputtering, and/or other suitable metal material deposition techniques to respectively refill the second gate trench 266 and the recessed region 268 with one or more of the above-described conductive materials.

Figure 2M:
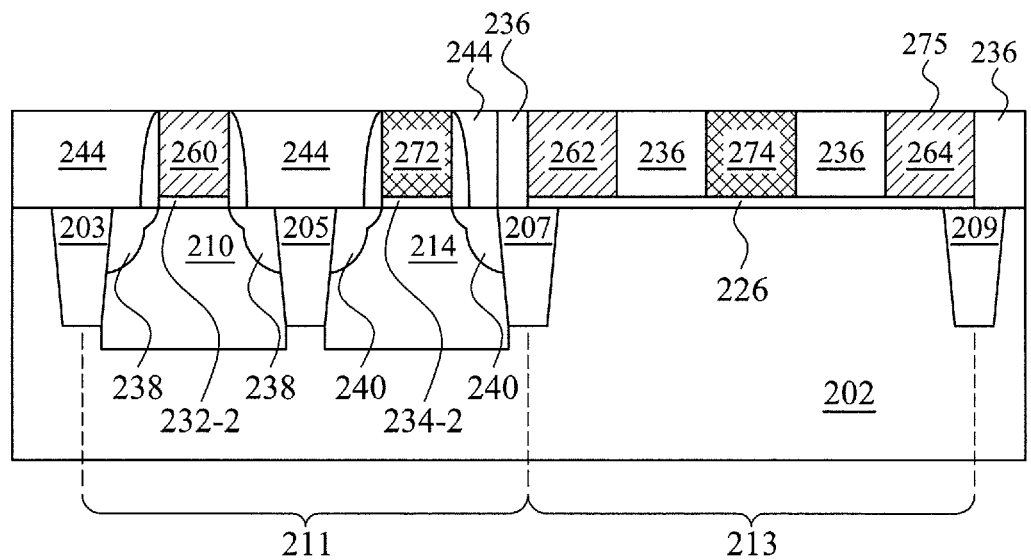

Corresponding to operation 126 of FIG. 1C, FIG. 2M is a cross-sectional view of the semiconductor device 200 including a metal gate 272 and a polishing resistance structure 274, which are formed at one of the various stages of fabrication, in accordance with some embodiments. In some embodiments, the metal gate 272 and the polishing resistance structure 274 are concurrently formed by using the CMP process to polish the conductive layer 270 (FIG. 2L) until the metal gate 272 and the polishing resistance structure 274 share a coplanar top surface 275. In some embodiments, such a top surface 275 may be also coplanar with respective top surfaces of other features, e.g., 236, 244, 260, 262, 264, etc. In some embodiments, since the metal gate 272, together with the second semiconductor well 214, the second gate dielectric layer 234-2, and the source/drain features 240, may form an n-type MOSFET, the metal gate 272 is herein referred to as an n-type metal gate 272.

Although not shown, a plurality of contact plugs (e.g., tungsten contact plugs) may be formed within another low-k dielectric layer overlaying the polished coplanar top surface 275 to electrically couple respective conductive features 238, 240, 260, 262, 264, and 272. As such, the p-type MOSFET, formed by the first semiconductor well 210, the p-type metal gate 260, the first gate dielectric layer 232-2, and the source/drain features 238, can be electrically coupled to one or more other electric components through the respective contact plugs; the n-type MOSFET, formed by the second semiconductor well 214, the n-type metal gate 272, the second gate dielectric layer 234-2, and the source/drain features 240, can be electrically coupled to one or more other electric components through the respective contact plugs; and the thin film resistor, formed by the metal thin film 226, the contact structures 262 and 264, and the polishing resistance structure 274, can be electrically coupled to one or more other electric components through the respective contact plugs.

According to some embodiments of the present disclosure, as the polishing resistance structure provides additional support to the dummy portion 236 while performing the above-described CMP process, which may advantageously minimize the occurrence of the dishing/erosion effect, the material forming the polishing resistance structure 274 may be referred to as a polishing resistance material. Although in the above discussions, the polishing resistance structure 274 is formed by refilling the recessed region 268 (FIG. 2K) with the conductive layer 270 that includes one or more gate material layers, it is noted that the recessed region 268 may be refilled with any of any of a variety of materials that can provide additional support to the dummy portion 236 while being polished while remaining within the scope of the present disclosure. For example, the recessed region 268 may be refilled with a material selected from a group consisting of: a metal-based material, an oxide-based material (e.g., silicon oxide, etc.), a ceramic-based material, and a combination thereof.

Further, although the above-described thin film resistor (formed by the metal thin film 226, and the contact structures 262 and 264) is formed concurrently with the p-type and n-type MOSFETs, it is understood that such a thin film resistor including at least one polishing resistance structure can be also formed subsequently to the formation of the p-type and n-type MOSFETs (e.g., in a back-end-of-line (BEOL) process) while remaining within the scoped of the present disclosure. Still further, although the above discussion is directed to concurrently forming the p-type metal features 260/262/264 and then forming the n-type metal gate 272 while using the polishing resistance structure 274 against the CMP process, it is understood that the doping polarities of the metal features 260/262/264 and metal gate 272 can be switched while remaining within the scoped of the present disclosure. That is, by using the disclosed method 100, "n-type" metal features 260/262/264 can be concurrently formed and then a "p-type" metal gate 272 can be formed while using the polishing resistance structure 274 against a CMP process.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an embodiment, a semiconductor device includes: a metal thin film disposed on a semiconductor substrate; and first and second contact structures disposed on the metal thin film, wherein the first and second contact structures are laterally spaced from each other by a dummy layer that comprises at least one polishing resistance material.

In another embodiment, a semiconductor device includes: a semiconductor substrate; at least a first field-effect transistor (FET) disposed in a first region of the semiconductor substrate; and a thin film resistor disposed in a second region of the semiconductor substrate. The thin film resistor includes: a thin film disposed on the semiconductor substrate; first and second contact structures disposed on respective ends of the thin film; and a dummy layer disposed on the thin film and laterally between the first and second contact structures, wherein the dummy layer comprises at least one recessed region at least partially filled with a polishing resistance material.

In yet another embodiment, a method includes: forming a metal thin film in a resistor region on a semiconductor substrate; forming two contact structures on respective ends of the metal thin film, wherein the two contact structures are laterally spaced from each other by a dummy layer; forming a recessed region in the dummy layer, wherein the recessed region is laterally spaced apart from the two contact structures; and refilling the recessed region with a polishing resistance material.

What is claimed is:

1. A semiconductor device, comprising:
 a metal thin film disposed on a semiconductor substrate;
 first and second contact structures disposed on the metal thin film,
 wherein the first and second contact structures are laterally spaced from each other by a dummy layer that comprises at least one polishing resistance material, wherein the dummy layer and the at least one polishing resistance material are disposed on the metal thin film between the first and second contact structures, and wherein the first and second contact structures have a p-type work function and the at least one polishing resistance material has an n-type work function; and
 a transistor gate structure disposed adjacent to the first contact structure, wherein a material of the transistor gate structure is the same as the at least one polishing resistance material.

2. The device of claim 1, wherein the at least one polishing resistance material is selected from a group c consisting of a metal-based material, an oxide-based material, a ceramic-based material, and a combination thereof.

3. The device of claim 1, wherein the at least one polishing resistance material further comprises a barrier material.

4. The device of claim 3, wherein the barrier material is selected from a group consisting of: titanium (Ti), tantalum (Ta), titanium nitride (TiN), tantalum nitride (TaN), and a combination thereof.

5. The device of claim 1, wherein the metal thin film, and the first and second contact structures form a thin film resistor.

6. The device of claim 1, wherein the dummy layer is formed of a polysilicon material.

7. The device of claim 1, wherein the at least one polishing resistance material is laterally spaced apart from the first and second contact structures, respectively, by part of the dummy layer.

8. The device of claim 1, wherein the at least one polishing resistance material directly contacts part of the metal thin film.

9. A semiconductor device, comprising:
a semiconductor substrate;
at least a first field-effect transistor (FET) disposed in a first region of the semiconductor substrate; and
a thin film resistor disposed in a second region of the semiconductor substrate, the thin film resistor comprising:
a thin film disposed on the semiconductor substrate;
first and second contact structures disposed on respective ends of the thin film;
a dummy layer disposed on the thin film and laterally between the first and second contact structures, wherein the dummy layer comprises at least one recessed region at least partially filled with a polishing resistance material, wherein the dummy layer and the polishing resistance material are disposed on the thin film between the first and second contact structures, and wherein the first and second contact structures have a p-type work function and the polishing resistance material has an n-type work function; and
a transistor gate structure disposed adjacent to the first contact structure, wherein a material of the transistor gate structure is the same as the at least one polishing resistance material.

10. The device of claim 9, wherein the polishing resistance material comprises at least one of: a metal-based material, an oxide-based material, a ceramic-based material, and a combination thereof.

11. The device of claim 9, wherein the thin film is formed of a metal material selected from a group consisting of: titanium (Ti), tantalum (Ta), titanium nitride (TiN), tantalum nitride (TaN), tungsten (W), tungsten nitride (WN), and a combination thereof.

12. The device of claim 9, wherein the dummy layer is forming of a polysilicon material.

13. The device of claim 9, wherein the first and second regions are laterally spaced apart from each other by an isolation feature.

14. The device of claim 9, further comprising:
at least a second FET disposed in the first region of the semiconductor substrate,
wherein the first and second FETs each has a respective metal gate.

15. The device of claim 14, wherein the metal gate of the first FET includes a metal layer with a work function greater than 5.2 eV, and the metal gate of the second FET includes a metal layer with a work function less than 4.2 eV.

16. The device of claim 15, wherein the recessed region of the thin film resistor that is at least partially filled with the polishing resistance material and the metal gate of the first FET are concurrently formed.

17. The device of claim 15, wherein the first and second contact structures of the thin film resistor and the metal gate of the second FET are concurrently formed.

18. A method, comprising:
forming a metal thin film in a resistor region on a semiconductor substrate;
forming two contact structures on respective ends of the metal thin film, wherein the two contact structures are laterally spaced from each other by a dummy layer;
forming a recessed region in the dummy layer, wherein the recessed region is laterally spaced apart from the two contact structures;
filling the recessed region with a polishing resistance material, wherein the dummy layer and the polishing resistance material are disposed on the metal thin film between the first and second contact structures, and wherein the first and second contact structures have a p-type work function and the polishing resistance material has an n-type work function; and
forming a transistor gate structure disposed adjacent to the first contact structure, wherein a material of the transistor gate structure is the same as the at least one polishing resistance material.

19. The method of claim 18, wherein the forming two contact structures on respective ends of the metal thin film comprises concurrently forming a p-type metal gate for a p-type first field-effect transistor (FET) in a transistor region on the semiconductor substrate.

20. The method of claim 18, wherein the filling the recessed region with a polishing resistance material comprises concurrently forming an n-type metal gate for an n-type first field-effect transistor (FET) in a transistor region on the semiconductor substrate.

* * * * *